United States Patent [19]

Prinz

[11] Patent Number: 5,025,416
[45] Date of Patent: Jun. 18, 1991

[54] THIN FILM MAGNETIC MEMORY ELEMENTS

[75] Inventor: Gary A. Prinz, Alexandria, Va.

[73] Assignee: The United States of America as represented by the Secretary of the Navy, Washington, D.C.

[21] Appl. No.: 360,173

[22] Filed: Jun. 1, 1989

[51] Int. Cl.$^5$ .............................................. G11C 11/14
[52] U.S. Cl. ..................................... 365/170; 365/171
[58] Field of Search ..................... 365/161, 170, 9, 87, 365/171

[56] References Cited

U.S. PATENT DOCUMENTS 3,037,199  5/1962  Grant ................................. 365/170

OTHER PUBLICATIONS

J. J. Coughlin et al., "Non-Destructive Readout for Thin Film Memory", IBM Technical Disclosure Bulletin, vol. 3, No. 10, Mar. 1961, p. 71.
P. I. Hershberg, "Ferromagnetic Domains", Electro-Technology Science & Engineering Series 37, Jan. 1962, pp. 71-82.
Prinz et al., "Molecular Beam Epitaxial Growth of Single-Crystal Fe Films on GaAs", printed in Appl. Phys. Lett. 39(5), Sep. 1, 1981, pp. 397-399.
Heck, "Magnetic Materials and Their Applications", published in the United States by Crane, Russak & Company, Inc., Magnetic Materials for Information Storage, pp. 623-632, 1974.

*Primary Examiner*—Joseph A. Popek
*Attorney, Agent, or Firm*—Thomas E. McDonnell; Peter T. Rutkowski; Lawrence A. Root

[57] ABSTRACT

A magnetic memory element is fabricated from a thin magnetic film wherein the magnetic film is grown on a lattice-matched substrate and subsequently patterned to form a closure domain. The closure domain is comprised of a plurality of legs which are joined at domain walls. The individual legs are patterned in the thin magnetic film to lie parallel to an easy axis of the thin film crystal structure being used. Thus, each closure domain represents a magnetic memory element. Fringing fields about the memory elements are eliminated due to the closure domain design. An array of such closure domains can be grown on a substrate and can be packed to high densities up to the limits of current lithographic technology. Such thin film magnetic memory arrays are non-volatile and are compatible with existing RAMs.

16 Claims, 3 Drawing Sheets

THIN FILM MAGNETIC MEMORY ELEMENTS

BACKGROUND OF THE INVENTION

1. Field Of The Invention

This invention is directed to a high density magnetic film memory storage device, and more particularly to such a memory storage device wherein the individual storage elements are patterned on a substrate using the intrinsic and structural anisotropies of the particular magnetic film, such that fringing fields about each storage element are eliminated.

2. Background Description

The first commercial random access nonvolatile magnetic memories were magnetic core systems in which circular magnetic ferrite cores were used as memory element, were arranged in large 3-dimensional arrays, and were coupled to selected wire wraps for reading and writing. These first magnetic arrays were physically large, required large amounts of power and consequently were characterized by high heat dissipation, and were very expensive to fabricate.

With the current desire to increase the information which can be processed on computer chips is the need to reduce the size of the associated memory storage space. Current semiconductor storage elements, e.g. RAM's, require a power source to retain their memory (volatile). Semiconductor memory elements will not work when the density is increased beyond a certain point because they depend upon having a sufficient amount of electrical charge per memory element, which amount becomes insufficient at a certain size. Thus when the density is too high, the amount of electrical charge in each element is too small. In contrast, the density of magnetic film storage elements can be much higher than semiconductor memory elements. Furthermore, semiconductor storage devices are not radiation hard and are subject to electromagnetic pulses.

High density magnetic film memory storage devices, such as bubble memory, on the other hand do not require a power source to retain their memory (nonvolatile). However, bubble memories are susceptible to slow-switching rates, high temperature dependence, and low stability of the bubble position. Therefore, the nonvolatility of bubble memories is unreliable as a practical matter and the current systems and methodologies used for practical utilization of bubble memories are complex and often difficult to integrate into the more conventional circuitry of present computer and memory systems.

The use of thin magnetic films of permalloy to form memory elements is described in *Magnetic Materials And Their Applications*, by Dr-Ing et al. pp. 623-632 (1974). The procedure described uses substrates of glass having a film of permalloy evaporated thereon. Lithography is then used to leave small spots of magnetic material, and it was learned that, if during the evaporation process, a large magnetic field is appied, the easy axis of all the spots will be aligned in a particular direction. The problem with this procedure is that every spot has a fringing field due to "open" magnetic flux, thus unwanted coupling will occur with the result that the elements can not be packed as closely as is desirable. When the spots are moved further apart, to avoid the negative affect of the fringing fields, the density to which the memory elements cam be packed will decrease. Also, after one spot has its magnetic field aligned, it will switch after a few weeks, by itself. This phenomenon is called "creep".

SUMMARY OF THE INVENTION

Accordingly, it is a general object of the invention to increase the density of nonvolatile thin film magnetic memory elements on a chip.

It is another object of the invention to create a thin film magnetic memory element which is radiation hard and is not subject to electromagnetic pulses.

It is a more specific object of the invention to eliminate the fringing fields around individual magnetic memory elements.

It is a further object of the invention to maximize the anisotropies of the magnetic thin film memory elements such that stray fields will not cause spontaneous or unprogrammed switching.

In one aspect of the present invention, this is accomplished by providing a thin film magnetic memory element which includes a single crystal substrate having a closure domain on top of the substrate. The closure domain is formed by first growing a single crystal magnetic film which is lattice-matched to the substrate, and patterning the film such that it forms the closure domain. The closure domain includes a plurality of legs, with each of the legs being oriented along an easy axis of the single crystal magnetic film wherein the legs join at domain walls. The memory element also includes a means for magnetizing the closure domain in one of a first and second directions, whereby said closure domain can be magnetized in the first direction indicating a "1" bit or the second direction, opposite the first direction, indicating a "0" bit. An insulating layer, which is deposited on top of the closure domain, separates the closure domain from the magnetizing means. The closure domains eliminate fringing fields thus allowing the closure domains to be packed at a high density on a chip. The magnetic memory is easily fabricated, is nonvolatile, and is compatible with existing RAMs.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DESCRIPTION OF THE PREFERRED EMBODIMENT

Figure 1A:
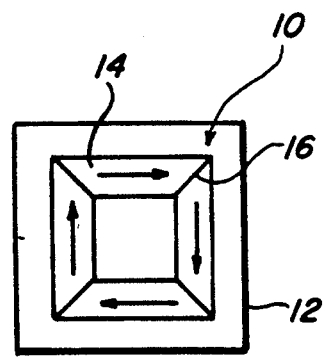
FIGS. 1(a-b) illustrate the various patterns of the magnetic thin films, which take different forms depending on the different crystal faces.
Figure 1B:
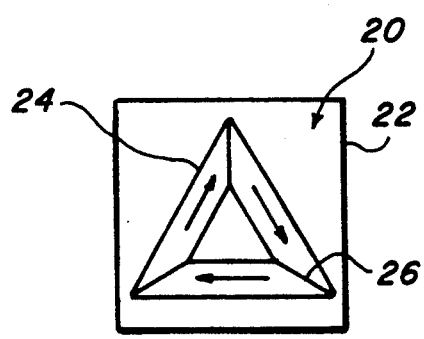

Referring to FIGs. 1a to 1b, there is shown two different configurations for thin film magnetic memory elements which utilize the various anisotropies in the films to form closure domains 10 and 20 grown respectively on lattice-matched substrates 12 and 22. These closure domains take different forms on the different crystal faces. For instance, FIG. 1a shows the (100) face, which for Fe, has two easy axes, i.e. (010) and (001). FIG. 1b shows the (111) face which for Fe has three equivalent easy axes, which form a triangular closure domain 20. The individual legs 24 of the magnetic film are patterned along an easy axis and are joined at domain walls 27, forming the triangular closure domain 20. Thus for sufficiently thin films (less than 1 $\mu$m), where the magnetic moment is confined to a plane, a single domain may be accomplished over the whole film. These magnetic properties are exploited to form magnetic memory elements which avoid problems found with earlier thin-film memory devices, which had surface (or edge) magnetic poles causing fringing fields as described in the Background Of The Invention. These fields connected neighboring elements, which was highly undesireable. Also, in order to minimize the applied field for switching an element, the anisotropies were so low that stray fields would cause spontaneous (or unprogrammed) switching. Although various crystal faces may be exploited, it is easiest to illustrate the idea with a (100) face as shown in FIG. 1a. If the evaporated magnetic film is patterned to form a closure domain 10 in the form of a "picture frame" element as shown above in FIG. 1a, the modern day equivalent of the ferrite toroidal core memory element in common use in core magnetic memory is formed. The closure domain 10 of FIG. 1a has four legs 14 which are patterned along an easy axis and are joined at domain walls 16.

Figure 2:
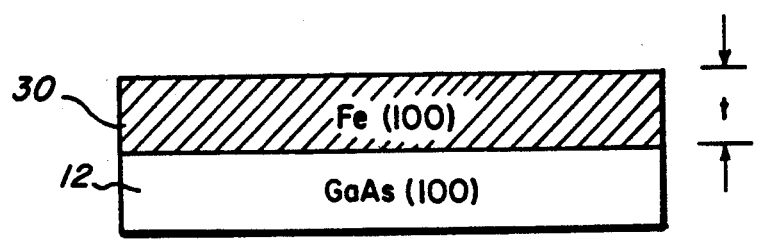
FIG. 2 illustrates the initial step in the procedure for growing the thin magnetic film on a substrate.
Figure 3:
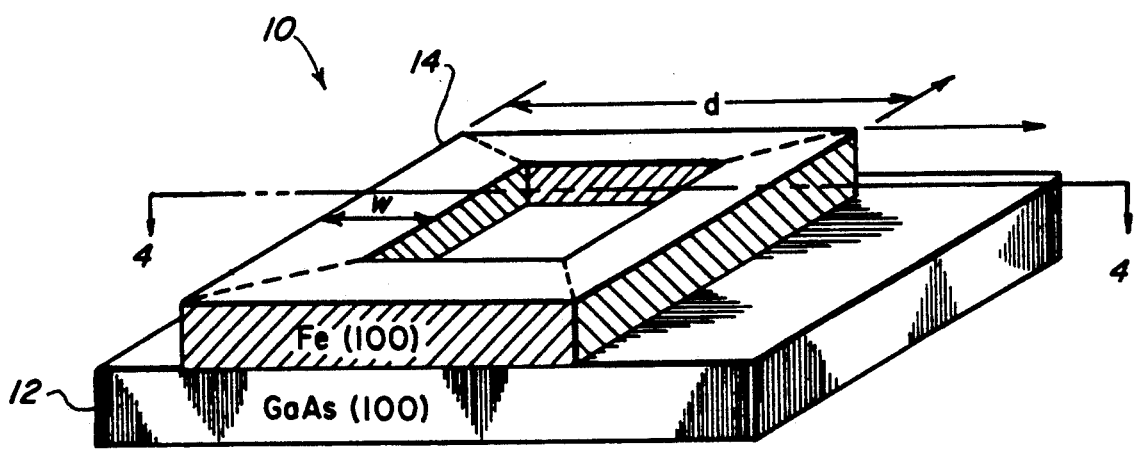
FIG. 3 is the structure of FIG. 2 after etching to form the magnetic closure domain for a single magnetic memory element.
Figure 4:
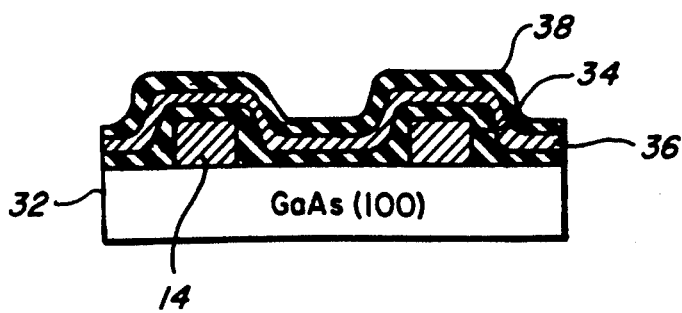
FIG. 4 illustrates the structure of FIG. 3 after subsequent layers of an insulating film, a conducting film, and a second insulating layer have been deposited.

FIGS. 2 through 5 show a process for fabricating thin film magnetic memories utilizing the "picture frame" closure domain 10 of FIG. 1a. First, a single-crystal Fe film 30 is grown on a lattice-matched GaAs substrate 12 through the use of molecular beam epitaxy as shown in FIG. 2. The thickness of the Fe layer 30 is preferably between 100 Å and 1 $\mu$m. The substrate 12 may also be any lattice-matched substrate such as ZnSe, Ge, AlAs, etc. Furthermore, other techniques such as vacuum deposition, sputtering, electrolysis, metal organic chemical vapor deposition or other suitable techniques can be used to deposit the magnetic film. The technique for the MBE growth of single-crystal films of iron on GaAs, which is now well known, was reported for the first time in an article by G. A. Prinz and J. J. Krebs in *Appl. Phys. Lett.* 39(5), Sept. 1, 1981, "Molecular Beam Epitaxial Growth Of Single-crystal Fe Films On GaAs". As shown in FIG. 3, the Fe film 30 has been selectively removed via lithography, e.g. ion beam etching or other suitable technique to leave a magnetic "picture frame" memory element 10 with its legs 14 oriented along the (100) directions which is its easy axis. In FIG. 3, the width w of a leg 14 of the magnetic memory elements is preferably between 300 Å and 2000 Å and the length of a leg is preferably between 300 Å and 1 $\mu$m. FIG. 4 is a cutaway view of FIG. 3 along the lines 4—4. As shown in FIG. 4, the structure of FIG. 3 is then coated with electrically insulating film 34 such as SiO, SiO$_2$ or their equivalent. A conducting film 36, such as Ag, Al, Cu, etc., is then deposited in a known manner, and a second insulating film 38 is then deposited on the conducting layer 36.

Figure 5:
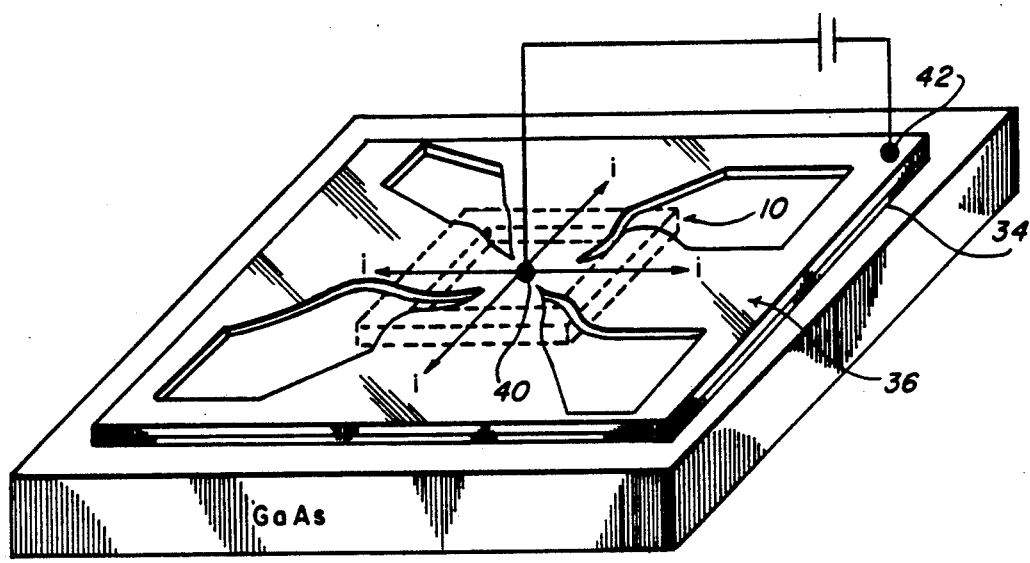
FIG. 5 is a perspective view of the preferred embodiment of a single magnetic memory storage element with a conducting film being configured in a "maltese cross" configuration to switch the state of the magnetic memory element in a first, or second direction, opposite to the first direction.

As shown in FIG. 5, prior to applying the second insulating film 38, the conducting film 36 is patterned into the shape of a "maltese cross" using an appropriate lithographic process, leaving the domain walls 16 of the "picture frame" closure domain 10 uncovered. At the domain walls 16, the direction of the magnetic domains change from a first easy axis to a second easy axis. The conducting film 36, which is etched in the shape of the "maltese cross" is then covered by the second insulating film 38.

After the second insulating film 38 is applied, and etched for contact holes, contact is made to the centerpoint 40 of the conducting film 36 and at a point 42 on the outside surrounding ring for causing a current to flow as will be described. The second insulating film 38 is not shown in FIG. 5, as it is in FIG. 4, for ease of viewing the preceding layers. Current travelling between the two contact points 40 and 42 creates a magnetic field in the "picture frame" closure domain 10 sufficient to magnetize the "picture frame" closure domain 10 in a desired direction. Reversing the current, magnetizes the "picture frame" closure domain 10 in the opposite direction. The magnetization of the "picture frame" closure domain 10 in a first direction can represent a memory element having a "1" bit stored therein and magnetization in a second direction, opposite to the first direction, can represent a memory element having a "0" bit stored therein. Thus data corresponding to the state of magnetization can be written into the "picture frame" closure domain 10 and the data stored in a memory element can be read out in a similar manner. The symmetric shape of the "maltese cross" configured conducting film 36 ensures that the current is evenly distributed in the four arms of the closure domain 10. It also gives the maximum current and provides the proper field for switching a memory element. The current is a sheet current. It is necessary to minimize the inductance and the capacitance of the conducting layer 36 because the magnetic memory element is capable of very fast switching, i.e. $10^{-9}$sec. To achieve low inductance and capacitance, a small overlay area is desirable, and to obtain high current, a large overlay area is desirable. Thus there is a tradeoff in the design of the conducting layer 36 between low inductance and capacitance on the one hand, and high current on the other hand.

Figure 6:
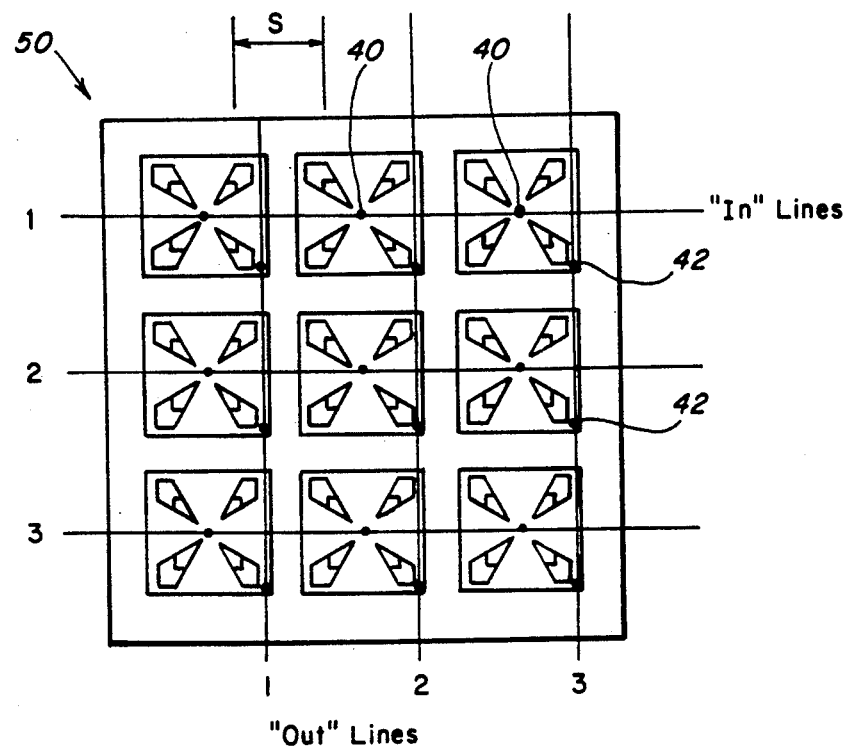
FIG. 6 is a plan view of an array of magnetic memory storage elements with lines for inputting memory data.

An array 50 of such magnetic memory elements of FIG. 5 can be formed on a single memory chip as shown in FIG. 6. As shown in FIG. 6, the contact lines contacting the center spots 40 are labeled "in" lines and those contacts which are shown contacting the surrounding rings 42 are called "out" lines. To magnetize element (1,1) current is passed through "in" line number 1 and "out" line number 1. Similarly to magnetize any element (n,m) current is passed through "In" line n and "Out" line m. Reversing the current reverses the magnetization of any element. Since there is no fringing field from any one "picture frame" memory element to an adjacent memory element, the spacing x of memory elements, shown in FIG. 6, need only be large enough to avoid dipolor coupling fields between the surfaces of the "picture frame" memory elements. The coupling field if given by $H=\mu/s^3$ where $\mu=0.9\times 10^{-20}$ erg/oe. For $s=10$ Å $=10^{-7}$cm, $H=0.1$oe, which is only about 1% of the coercive field $H_c$ necessary to reverse the magnetization of the "picture frame" memory element. In practice, there is no equipment that can fabricate the memory elements so close. The best that can be hoped for is a 100 Å gap between memory elements. Thus, the magnetic memory elements as described can be packed right up to the limits of current technology. This is not true for semi-conductor memory devices due to the deficiency of carriers as described in the Background of the Invention. The current passing through the conducting film 36 necessary to reverse the magnetization is given by $I=H_c(2\pi r)$ where r is the distance between the conducting layer 36 and the magnetic material. Assuming a practical value of 1000 Å, $I=6$ mamp, which need only be provided as a pulse of $10^{-6}$ sec long.

Once the device of FIG. 6 is fabricated with a grid of wires as shown, it is perfectly compatible with conventional semi-conductor memory such as random access memories (RAMs) and all the technology developed over the years for semi-conductor memory. Furthermore, the array 50 is compatible with convention random access memories (RAM's) in regard to the procedure for writing into and reading from memory used in those devices which is well known.

Figure 7:
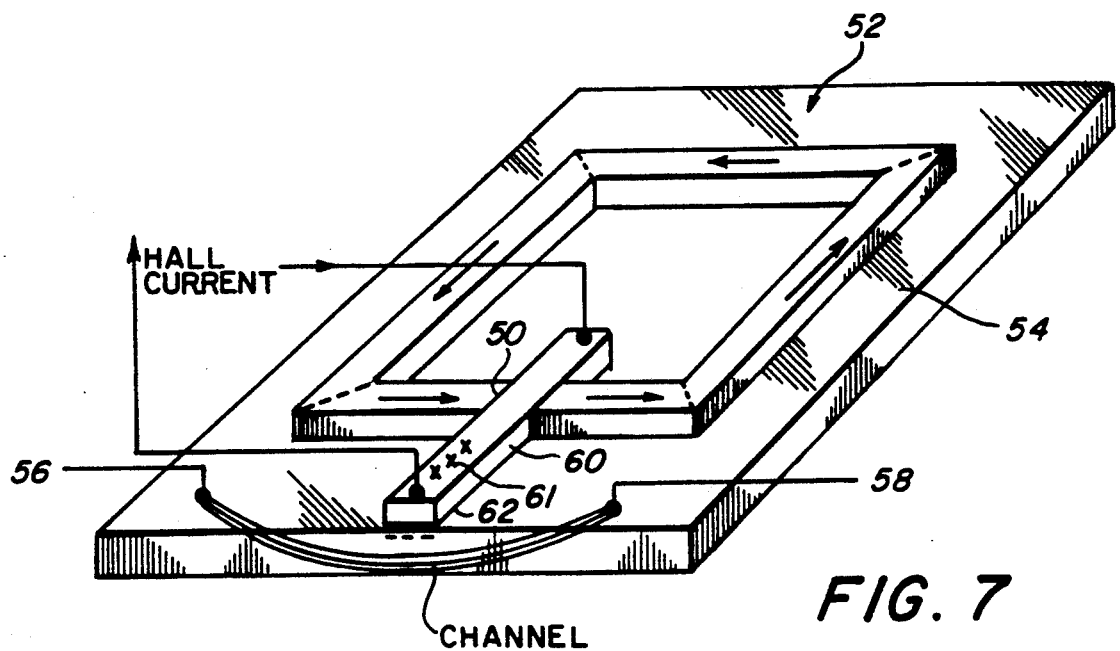
FIG. 7 is a perspective view of a second embodiment of a single magnetic memory storage element which uses a Hall bar to read the state of the magnetic memory element in a first, or a second direction, opposite to the first direction.

In FIG. 7 there is shown a magnetic memory element which utilizes a Hall bar 60 for reading out the state of magnetization of the magnetic memory element. A cut 51 is made in the pattern for the magnetic "picture frame" closure domain 52. The magnetic element is deposited upon a substrate 54 previously prepared by an appropriate doping to form an FET structure with source 56 and drain 58 regions as shown, oriented under the cut 51 in the magnetic element 52. In the cut 51, a Hall-effect bar 60, of an appropriate material, is deposited. Bismuth is one material which will show a Hall effect.

In operation, the state of magnetization of the magnetic memory element 52 can be read by injecting a Hall current through the bar 60. The magnetic field across the bar 60, due to its being located in the magnetic circuit gap, will cause a Hall voltage to be generated on the top 61 and bottom 62 surfaces of the Hall bar 60. The bottom surface 62 acts as the gate of the FET structure, thus the signal through the FET will read the direction of the magnetization of the magnetic memory element 52, since a reversal of the magnetization, will reverse the Hall polarity and therefore reverse the FET gate polarity. Depending on the resistance in the channel of the FET, there is either a "1" bit or a "0" bit stored in the magnetic memory element 52. Thus, if the magnetic memory element 52 is appropriately doped to establish source 56 and drain 58 regions, then a Hall voltage above the channel either turns the FET on or off representing a "1" bit or a "0" bit respectively. Although not shown in FIG. 7, the magnetic memory element of FIG. 7 could utilize the "maltese cross" conductor configuration as described above in regard to FIG. 5, or any suitable alternate means of changing the state of magnetization of the individual memory elements. The magnetic storage element and electronic readout circuit can be formed as a single integrated circuit device.

The foregoing has described a thin film magnetic memory element wherein a magnetic film is grown on a lattice-matched substrate and subsequently patterned to form a closure domain. The closure domain is comprised of a plurality of legs which are joined at domain walls. The individual legs are patterned in the thin film to lie parallel to an easy axis of the crystal structure of the thin film magnetic material being used. Thus, each closure domain represents a magnetic memory element. The legs of the closure domain are aligned with the easy axis of the single crystal magnetic film to utilize the intrinsic anisotropies of the crystalline structure, and the legs are also patterned such that a closure domain is formed to take advantage of the structural anisotropies. The distance between "picture frame" closure domains has to be less than the exchange interaction that lines up the magnetic dipoles inside, which is on the order of 10 angstroms.

The advantage of the thin-film element is the ease of fabricating large numbers at high packing densities. For example, the lack of fringing fields permits spacings on the order of 10 $\mu$m, so a 1 cm chip could hold approximately $10^6$ elements. Also the magnetic memory is compatible with existing RAMs. Proper choice of film material will permit low switching fields, and in the absence of fringing fields from neighboring elements, one need only magnetically shield the whole chip with appropriate packaging.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A thin film magnetic memory element, comprising:
    a single crystal substrate; and
    a closure domain on top of said substrate, wherein said closure domain is a single crystal magnetic film which is lattice-matched to said substrate, said closure domain includes a plurality of legs, with each of said legs being oriented along an easy axis of said single crystal magnetic film with said legs joining at domain walls.

2. The magnetic memory element of claim 1, wherein said memory element further includes:
    a first insulating layer on top of said closure domain; and
    means for magnetizing the closure domain in one of a first and second directions, whereby said closure domain can be magnetized in said first direction indicating a "1" bit or said second direction, opposite said first direction, indicating a "0" bit.

3. The magnetic memory element of claim 2, wherein said means for magnetizing said closure domain in one of a first direction and a second direction comprises:
    a conducting film deposited on said first insulating layer, said conducting film is etched in the shape of a "maltese cross" such that the domain walls of said closure domain are left uncovered;
    a second insulating layer above said conducting film which has holes etched therein for making contact to said conducting film; and
    means for making electrical connection to said conducting film for magnetizing said closure domain in one of a first direction and a second direction, opposite said first direction.

4. The magnetic memory element of claim 2, wherein said means for magnetizing said closure domain in one of a first direction and a second directions comprises:
- a conducting film deposited on said first insulating layer and etched in a shape such that portions of the domain walls of said closure domain are left uncovered;
- a second insulating layer above said conducting film which has holes etched therein for making contact with said conducting film; and
- means for making electrical connection to said conducting film for magnetizing said closure domain in one of a first direction and a second direction, opposite said first direction.

5. The magnetic memory element of claim 1 wherein the single crystal magnetic film is iron which is oriented in the (100) direction and the substrate is GaAs which is oriented in the (100) direction.

6. The magnetic memory element of claim 1 wherein the single crystal magnetic film is iron which is oriented in the (111) direction and the substrate is GaAs which is oriented in the (111) direction.

7. The magnetic memory element of claim 1, further comprising a means for reading the direction of magnetization of said closure domain.

8. The magnetic memory element of claim 7, wherein said means for reading the direction of magnetization of said closure domain comprises:
- a Hall bar which has been deposited into a cut in the closure domain;
- an FET structure which has been prepared in said single crystal substrate by appropriately doping said substrate to form source and drain regions;
- said Hall bar is positioned above said FET structure; and
- means for injecting a Hall current through said Hall bar such that the magnetic field across the Hall bar due to its being located in a magnetic circuit gap in the closure domain will cause a Hall voltage to be generated on the top and bottom surfaces of the Hall bar, such that the bottom surface acts as a gate of said FET structure, whereby the signal through the FET will read the direction of magnetization of the magnetic memory element.

9. An array of thin film magnetic memory elements on a chip, comprises:
- a single crystal substrate; and
- a plurality of closure domains on top of said substrate, wherein said plurality of closure domains are formed from a single crystal magnetic film which is lattice-matched to said substrate, each of said plurality of closure domains includes a plurality of legs, with each of said legs being oriented along an easy axis of said single crystal magnetic film with said legs joining at domain walls.

10. The array of thin film magnetic memory elements of claim 9, further comprising:
- a first insulating layer deposited on top of said plurality of closure domains; and
- means for magnetizing said plurality of closure domains in one of a first and second directions, whereby said closure domains can be magnetized in said first direction indicating a "1" bit or said second direction, opposite said first direction, indicating a "0" bit.

11. The array of thin film magnetic memory elements of claim 10, wherein said means for magnetizing said plurality of closure domains in one of a first direction and a second direction comprises:
- a conducting film deposited above said first insulating layer, said conducting film is etched in the shape of a "maltese cross" above each of said plurality of closure domains, such that the domain walls of said plurality of closure domains are left uncovered;
- a second insulating layer above said conducting film which has holes etched therein for making contact to said conducting film; and
- means for making electrical connection to said conducting film for magnetizing each of said plurality of closure domains in one of a first direction and a second direction.

12. The array of thin film magnetic memory elements of claim 10, wherein said means for magnetizing said plurality of closure domains in one of a first direction and a second direction comprises:
- a conducting film deposited on said first insulating layer and etched in a shape above each of said plurality of closure domains such that a portion of each domain wall of said plurality of closure domains is left uncovered;
- a second insulating layer above said conducting film which has holes etched therein for making contact to said conducting film; and
- means for making electrical connection to said conducting film for magnetizing each of said plurality of closure domains in one of a first direction and a second direction.

13. The array of thin film magnetic memory elements of claim 9, wherein the magnetic film is iron which is oriented in the (100) direction and the substrate is GaAs which is oriented in the (100) direction.

14. The array of thin film magnetic memory elements of claim 9, wherein said magnetic film is iron which is oriented in the (111) direction and the substrate is GaAs which is oriented in the (111) direction.

15. The array of thin film magnetic memory elements of claim 9, further comprising means for reading the direction of magnetization of said plurality of closure domains.

16. The array of thin film magnetic memory elements of claim 15, wherein said means for reading the direction of magnetization of said plurality of closure domains comprises:
- a plurality of Hall bars, wherein each of said Hall bars has been deposited into a cut in each of said closure domains;
- an plurality of FET structures, corresponding to each of said closure domain, which have been prepared in said single crystal substrate by appropriately doping said substrate to form source and drain regions for each of said closure domains;
- each of said Hall bars is positioned above said corresponding FET structure; and
- means for injecting a Hall current through each of said Hall bars such that the magnetic field across the Hall bars due to its being located in a magnetic circuit gap in the closure domain will cause a Hall voltage to be generated on the top and bottom surfaces of the Hall bar, such that the bottom surface of said Hall bar acts as a gate of said FET structure, whereby the signal through the FET will read the direction of magnetization of a corresponding magnetic memory element.

* * * * *